United States Patent
Maaskant et al.

(10) Patent No.: US 10,656,510 B2
(45) Date of Patent: May 19, 2020

(54) SUPERLUMINESCENT LIGHT EMITTING DIODE (SLED) DEVICE

(71) Applicant: UNIVERSITY COLLEGE CORK—NATIONAL UNIVERSITY OF IRELAND, CORK, Cork (IE)

(72) Inventors: Pleun Maaskant, Cork (IE); Brian Corbett, Cork (IE)

(73) Assignee: UNIVERSITY COLLEGE CORK, NUI, CORK, Cork (IE)

( * ) Notice: Subject to any disclaimer, the term of this patent is extended or adjusted under 35 U.S.C. 154(b) by 17 days.

(21) Appl. No.: 15/519,519

(22) PCT Filed: Oct. 19, 2015

(86) PCT No.: PCT/EP2015/074191
§ 371 (c)(1),
(2) Date: Apr. 14, 2017

(87) PCT Pub. No.: WO2016/059259
PCT Pub. Date: Apr. 21, 2016

(65) Prior Publication Data
US 2017/0227839 A1    Aug. 10, 2017

(30) Foreign Application Priority Data
Oct. 17, 2014 (GB) .................................. 1418506.0

(51) Int. Cl.
*H01L 33/50* (2010.01)
*H01S 5/026* (2006.01)
(Continued)

(52) U.S. Cl.
CPC ........ *G03B 21/2033* (2013.01); *H01L 31/173* (2013.01); *H01L 33/0045* (2013.01);
(Continued)

(58) Field of Classification Search
CPC ..... H01L 33/0045; H01S 5/2202; H01S 5/24; H01S 5/2027
See application file for complete search history.

(56) References Cited

U.S. PATENT DOCUMENTS 4,896,195 A    1/1990 Jansen et al.
5,974,069 A * 10/1999 Tanaka ................. H01S 5/2231
                                                257/E33.067
(Continued)

FOREIGN PATENT DOCUMENTS

| JP | 2010141240 | 6/2010 |
| WO | WO2004102680 | 11/2004 |
| WO | WO2013121051 | 8/2013 |

OTHER PUBLICATIONS

PCT/EP2015/074191. Int'l Search Report & Written Opinion (dated Dec. 23, 2015).

*Primary Examiner* — Brigitte A Patterson
(74) *Attorney, Agent, or Firm* — Loza & Loza, LLP; Anthony Smyth

(57) ABSTRACT

The invention relates to a SLED device emitting light from a substrate side, configured to suppress lasing, and comprising a reflective element (55) on a front surface of a substrate (22) configured to redirect an optical beam (light) onto a back surface of the substrate (22). In one embodiment the device can be used for making a compact RGB (red-green-blue) projector.

15 Claims, 11 Drawing Sheets

(51) Int. Cl.
| | |
|---|---|
| *H01S 5/04* | (2006.01) |
| *H01L 33/60* | (2010.01) |
| *G03B 21/20* | (2006.01) |
| *H01L 31/173* | (2006.01) |
| *H01L 33/00* | (2010.01) |
| *H01S 5/183* | (2006.01) |
| *H01L 27/15* | (2006.01) |

(52) U.S. Cl.
CPC ............ *H01L 33/507* (2013.01); *H01L 33/60* (2013.01); *H01S 5/026* (2013.01); *H01S 5/041* (2013.01); *H01S 5/183* (2013.01); *H01L 27/15* (2013.01)

(56) References Cited

U.S. PATENT DOCUMENTS

| | | | |
|---|---|---|---|
| 2005/0264715 A1 | 12/2005 | Kahen et al. | |
| 2008/0272379 A1 | 11/2008 | Laino et al. | |
| 2009/0066965 A1* | 3/2009 | Jayaraman | H01L 33/0045 356/497 |
| 2012/0307857 A1* | 12/2012 | Oh | H01S 5/026 372/46.01 |
| 2013/0208749 A1* | 8/2013 | Uchida | H01S 5/34 372/45.01 |
| 2013/0301012 A1* | 11/2013 | Mochizuki | H01L 33/38 353/31 |
| 2014/0016661 A1* | 1/2014 | Orita | H01L 33/02 372/50.1 |
| 2015/0115219 A1* | 4/2015 | Oh | G02B 6/00 257/13 |

\* cited by examiner

SLED with lens:
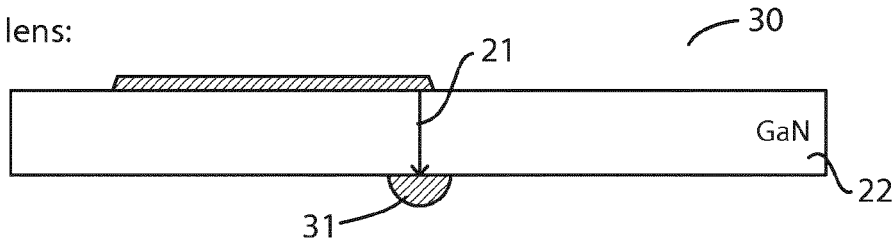
SLED with phosphor:
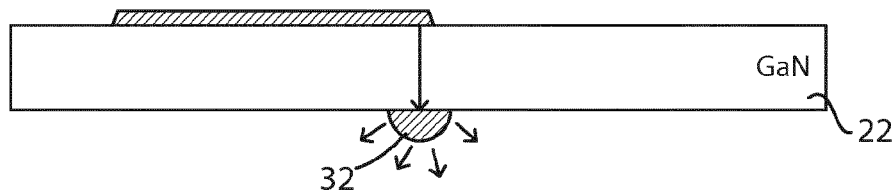
Amplifier:
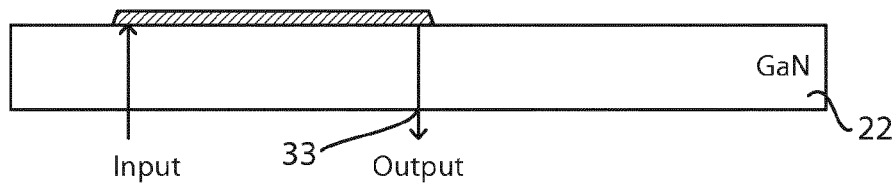
Figure 3
Multiple components
on a single silicon sub-mount:
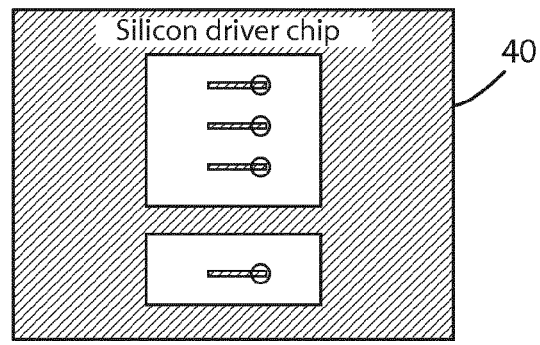
SLED/APD combination:
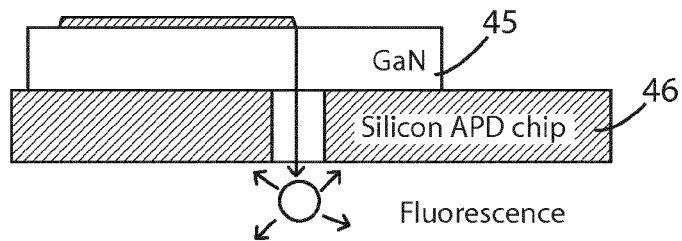
Figure 4a & 4b

SUPERLUMINESCENT LIGHT EMITTING DIODE (SLED) DEVICE

FIELD

The invention relates to a light source. In particular the invention relates to a substrate emitting superluminescent light emitting diode (SLED) device.

BACKGROUND

A SLED device can provide a lot of optical power from a very limited étendue. The étendu of a light source is the product of the area from which the light emanates, and the solid angle into which the light is emitted. This is very useful when one needs to squeeze as much light as possible into applications that themselves have a small étendu. On the light receiving end the étendu is the product of the aperture area through which the light enters the application and the solid angle from which light can enter the aperture area.

The amount of light that can be coupled from a light source into an application is limited by the component with the smallest étendu. For example if an application has an étendu of 1 $\mu m^2 \cdot sr$, the light source should have its power within this étendue-size, as all light that is emitted outside such an étendue is lost.

Laser diode/superluminescent light emitting diode LD/SLED devices differ greatly from LED devices: LD/SLED devices can emit 1,000 to 1,000,000 times more light into étendues of the order of 1-10 $\mu m^2 \cdot sr$ than LED devices. Numerous patent publications exist in the art of LD/SLED devices, for example U.S. Pat. Nos. 6,556,610; 5,974,069; 4,935,939; US2003/161371; U.S. Pat. Nos. 4,053,914 and 4,760,578.

A problem with LD/SLED devices is that they are complex and expensive to make. In the case of SLEDs, it is also desirable to minimise optical feedback and so prevent lasing as well as to provide a better beam quality beam spot. It is therefore an object to provide an improved SLED device and a method of making such devices.

SUMMARY

According to the invention there is provided, as set out in the appended claims, substrate emitting superluminescent light emitting diode (SLED) device comprising:
  a light source configured to emit an optical beam along a path substantially parallel to the substrate;
  a reflective element on a front surface of the substrate configured to reflect the optical beam and emit light via a back surface of the substrate in a substantially vertical direction to the substrate.

The SLED devices can be fabricated in a much more cost effective way than conventional LD/SLED devices, as there is no longer a need for cleaving of the wafer material. The SLED device hereinbefore described is designed to supress lasing. Other advantages are compactness and ease of integration.

In one embodiment the reflective element comprises a turning mirror configured to increase the optical power density on a structure.

In one embodiment the turning mirror is positioned at a substantially 45 degree angle to the front surface of the substrate.

In one embodiment the turning mirror is positioned at a substantially 45 degree angle to the front surface of the substrate, so that the reflected beam hits the back surface at normal incidence within 10 degrees of the back surface normal In one embodiment there is provided an elongated semiconductor ridge positioned on the front surface of the substrate and adapted to guide the optical beam along the path.

In one embodiment there is provided a substantially un-pumped lateral beam expansion gap positioned between the electrically pumped section of the ridge and the reflective element.

In one embodiment the length of the un-pumped beam expansion gap is at least 30 microns.

In one embodiment the reflective element comprises a curved turning mirror to reflect the optical beam.

In one embodiment the surface normal direction across a reflective area of the curved turning mirror varies by more than 10 degrees.

In one embodiment the reflective element comprises a curved turning mirror to reflect the optical beam.

In one embodiment the distance between the end of the LD/SLED ridge and the brightest spot on the mirror is at least 30 micrometer. This extra distance minimizes optical feedback and provides near ripple free SLED spectra.

In one embodiment a transparent window etched into an opaque substrate is provided to transmit the optical beam.

In one embodiment there is provided a laser source on the back surface of the substrate.

In one embodiment the laser source comprises a Vertical Cavity Surface Emitting Laser (VCSEL) diode.

In one embodiment there is provided a lens positioned at the back surface of the substrate where the light is emitted.

In one embodiment a phosphor coating or phosphor coated device is positioned at the back surface of the substrate where the light is emitted.

In one embodiment a photodetector is positioned at the back surface of the substrate where the light is emitted.

In one embodiment the photodetector comprises a perforated avalanche photodetector configured for fluorescence measurements.

In one embodiment a semiconductor light emitter is positioned at the back surface of the substrate where the light is emitted.

In one embodiment a dichroic reflector is positioned at the back surface of the substrate where the light is emitted.

In another embodiment there is provided a RGB projector system comprising:
  an array of devices; and
  each device is configured to emit a different colour wavelength.

In one embodiment there is provided an optically pumped laser source.

In one embodiment the laser source comprises a VCSEL laser source.

In one embodiment the substrate (back) surface of the wafer can be used to add functionality to a device, for example colour conversion through optically pumped lasing.

In one embodiment there is provided a vertical SLED on wafer material that is opaque at the emission wavelength.

In another embodiment there is provided a substrate emitting LD/SLED device comprising
  a reflective element on a front surface of the substrate configured to reflect an optical beam and emit light via a back surface of the substrate.

In a further embodiment there is provided system comprising

It will be appreciated that substrate emitting LDs/SLEDs (laser diodes/superluminescent light emitting diodes) are easy to fabricate, and therefore provide a low-cost fabrication route for these devices, especially in materials such as gallium nitride or other semiconductor materials on transparent substrates.

It will be appreciated that the substrate emitting LDs/SLEDs open up the way for extra functionality on the light emitting surface.

It will be appreciated that the device can be provided with extra functionality by combining it with optically pumped lasers (for example VCSELs: Vertical Cavity Surface Emitting Laser diodes) to generate other colours.

It will be appreciated that very thin LD/SLED wafers (coupons) of the invention in combination with a 45 degree turning mirror yield small optical spot sizes on the back surface, and therefore high power density levels on this back surface. This makes optical pumping of laser materials more effective.

In one embodiment the turning mirror can still be used in material systems where the substrate is opaque at the emission wavelength of the LD/SLED: in these situations the substrate can be fully removed, or alternatively a transparent window can be etched into the substrate to allow the light to exit vertically.

In one embodiment a focusing mirror increases the optical power density on the optically pumped VCSEL structure.

One application of the invention is in the area of compact R-G-B projectors.

It will be further appreciated that the invention can be applied to all III-V devices.

In one embodiment there is provided a horizontally emitting LD/SLED device with an etched output facet (and a diced chip).

In one embodiment there is provided a horizontally emitting LD/SLED device with the SLED beam emerging along the surface normal of the chip sidewall.

In one embodiment there is provided a horizontally emitting LD/SLED device with a platform incorporating the device as hereinbefore described and an optical fibre.

BRIEF DESCRIPTION OF THE DRAWINGS

The invention will be more clearly understood from the following description of an embodiment thereof, given by way of example only, with reference to the accompanying drawings, in which:—

FIG. 3 illustrates a number of embodiments with extra functionality on the light emitting substrate surface.

FIG. 4a shows how multiple light sources can be integrated with silicon driver circuitry.

FIG. 4b shows how a vertical LD/SLED could be used in combination with a perforated avalanche photo detector (APD) to provide an integrated source/detector module for fluorescence measurements.

DETAILED DESCRIPTION OF THE DRAWINGS

Figure 1:
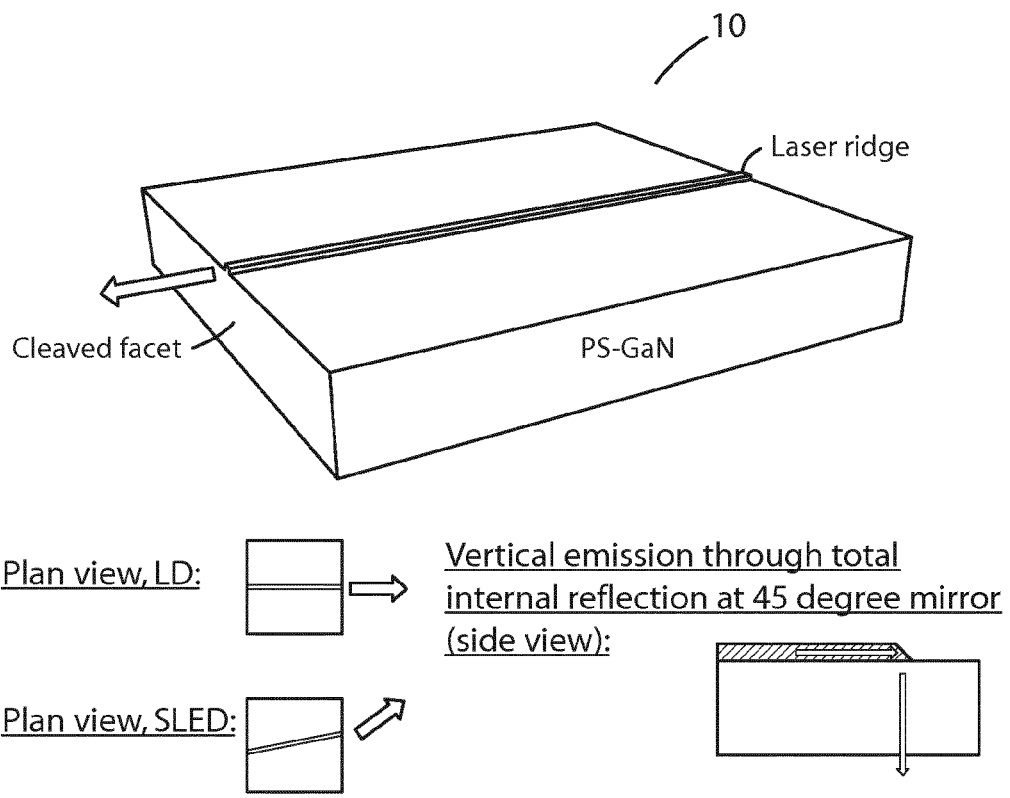
FIG. 1 illustrates a LD/SLED device with a vertical output beam according to one embodiment of the invention.

FIG. 1 illustrates a LD/SLED device with a vertical output beam according to one embodiment of the invention, indicated generally by the reference numeral 10. FIG. 1(a) shows three views of a conventional LD/SLED device where the light beam comes out in a horizontal plane to the substrate. The fourth view, FIG. 1(b), shows a substrate emitting LD/SLED device where a reflective element on a front surface of the substrate is configured to reflect an optical beam (light) and emit light via a back surface of the substrate in a substantially vertical plane. The reflective element can be a 45 degree mirror. By shaping the 45 degree mirror into a focusing mirror, the optical density on the back surface can be further increased, the operation of which is described in more detail with respect to the other figures.

Figure 2:
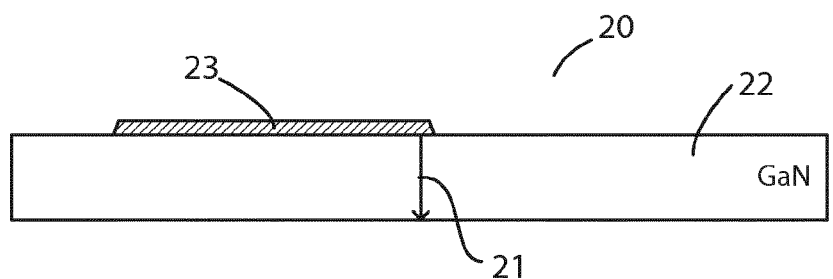
FIG. 2 illustrates a LD/SLED device with a vertical output beam on a GaN substrate.

FIG. 2 illustrates a LD/SLED device 20 with a substantially vertical output beam emitted 21 from one surface of a GaN substrate 22. A ridge 23 provides a guide for a light source along a horizontal direction with respect to the substrate 22.

FIG. 3 illustrates a number of embodiments, indicated generally by the reference numeral 30, with extra functionality on the light emitting substrate surface or the 'back surface' of the substrate 22. A lens 31 is positioned at the back surface of the substrate in the vicinity of where the light is emitted. Alternatively, a phosphor coating or phosphor coated device 32 is positioned at the back surface of the substrate where the light is emitted, or the device can act as an optical amplifier, providing an amplified optical output 33.

FIG. 4a shows how a plan view of multiple light sources 41, 42, 43, 44 can be integrated with silicon driver circuitry 40. FIG. 4b shows how a vertical LD/SLED device 45 can be used in combination with a perforated avalanche photo detector (APD) 46 to provide an integrated source/detector module for fluorescence measurements. A photodetector 46 can be positioned at the back surface of the substrate in the vicinity of where the light is emitted.

Figure 5A:
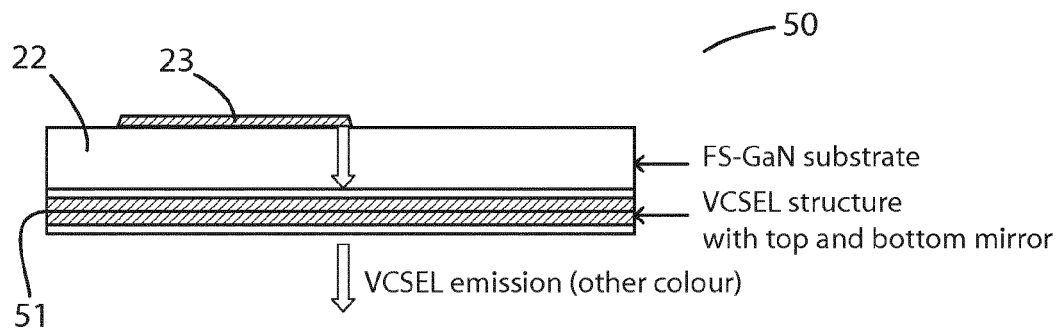
FIGS. 5a & 5b shows an optically pumped VCSEL (vertical cavity surface emitting laser), pumped by a GaN based LD/SLED with turning mirror, according to one embodiment.

FIG. 5a illustrates a substrate emitting LD/SLED with added functionality such as colour conversion and optically pumped lasing in secondary colours, indicated generally by the reference numeral 50. In this embodiment a laser source 51, such as a Vertical Cavity Surface Emitting Laser (VCSEL) diode, is positioned on the back surface to act as an optically pumped light source. The top mirror in the VCSEL structure has high reflectivity for the VCSEL wavelength and high transmission for a pump wavelength. The VCSEL can be attached to a FS-GaN wafer by wafer scale bonding, or by using coupons of VCSEL material and bonding these to the GaN wafer. The top mirror of the VCSEL can be deposited directly onto the FS-GaN wafer as shown in FIG. 5. The embodiment shown in FIG. 5a provides a low-cost and compact way to achieve optically pumped lasing. VCSELs with electrical injection are very difficult to realise in gallium nitride based materials, due to the difficulty in obtaining efficient injection of electrical current in the presence of highly reflective mirror structures. The invention provides VCSEL devices available in the blue-green part of the visible spectrum that heretofore were not available. In effect the invention provides an optically pumped alternative for an electrically pumped VCSEL.

Figure 5B:
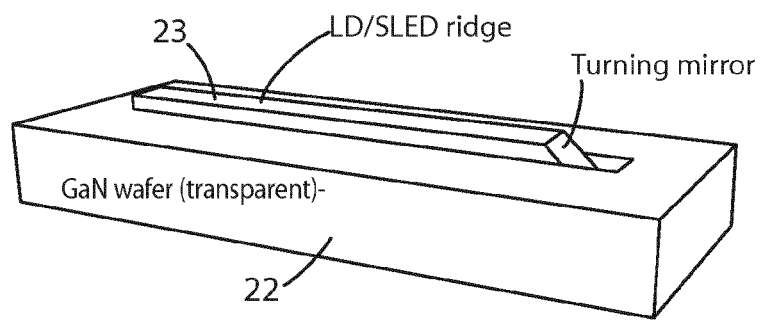
Figure 5B:
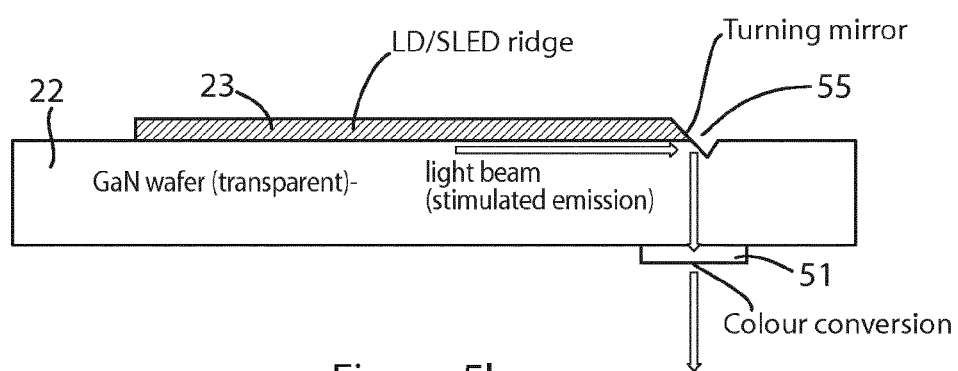

In FIG. 5b a short vertical path through an extremely thin version keeps the power density (mW·mm$^{-2}$) on the back surface high. This is of benefit in applications that require high power densities, without recourse to lenses to refocus the light. A reflective element 55, for example a turning mirror, is shown, the operation of which is now described.

Figure 6:
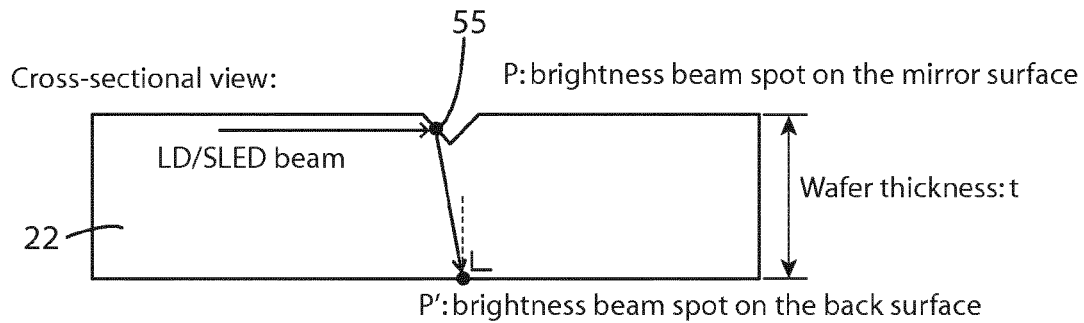
FIG. 6 illustrates a cross sectional view of a SLED Device wherein the verticality of the deflected beam is determined by the angle between PP' and the surface normal (to the back surface).
Figure 8A:
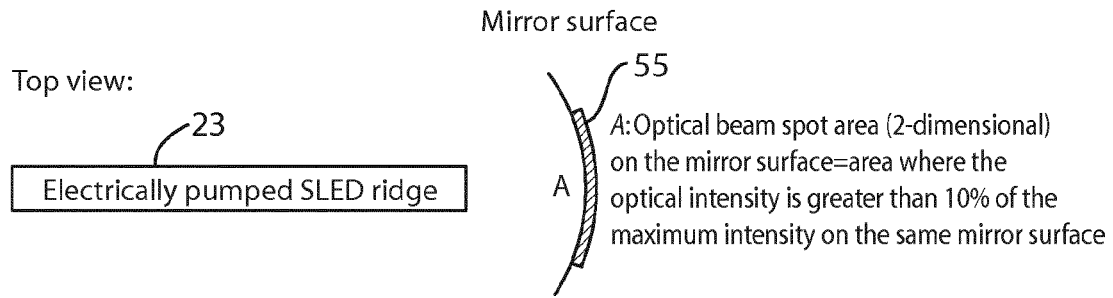
FIGS. 8a & 8b illustrates operation of a turning mirror in cooperation with the SLED device, according to one embodiment.
Figure 8B:
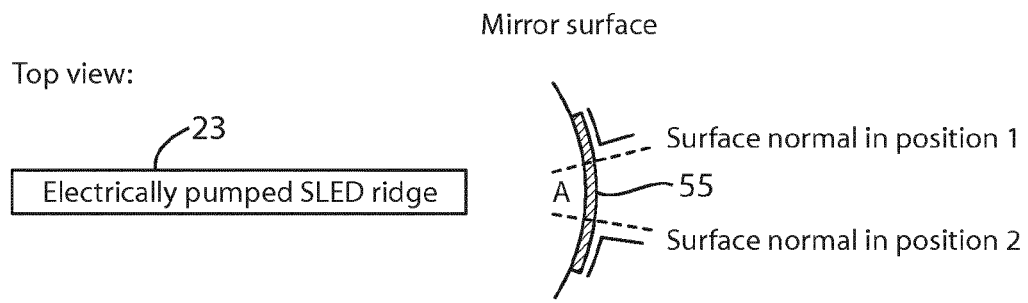

FIG. 6 illustrates a cross sectional view of a SLED Device wherein the verticality of the deflected beam is determined by the angle between PP' and the surface normal (to the back surface). The turning element 55 is positioned at a substantially 45 degree angle to the front surface of the substrate, so that the reflected beam hits the back surface at normal incidence within 10 degrees of the back surface normal. It will be appreciated that an elongated semiconductor ridge positioned on the front surface of the substrate is adapted to guide the optical beam along the path. As shown in FIGS. 8a and 8b a substantially un-pumped lateral beam expansion gap positioned between the electrically pumped section of the ridge and the reflective element. In one embodiment the length of the un-pumped beam expansion gap is at least 30 microns.

Figure 7:
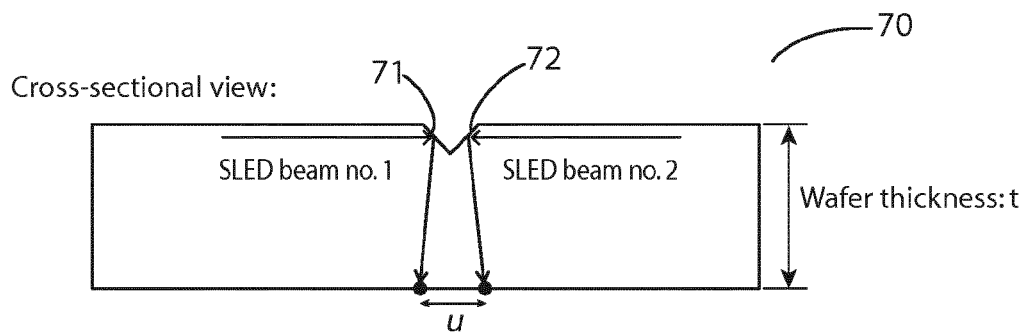
FIG. 7 illustrates a cross sectional view of two SLED devices.
Figure 7:
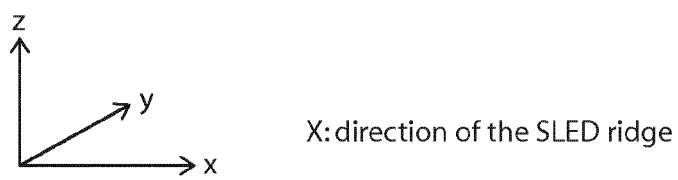

FIG. 7, similar to FIG. 6, illustrates two SLED devices 71 and 72 positioned to face each other and to provide two outputs at the back surface of the substrate. The distance 'u' is the distance between the brightest beam spots from SLED beams 71 and 72. It will also be appreciated that two SLED devices can be positioned side by side, giving beam spots with close proximity in the y-direction.

FIGS. 8a & 8b illustrates operation of a turning mirror in cooperation with the SLED device, according to one embodiment. In this embodiment the turning mirror (reflective element) comprises a curved turning mirror to reflect the optical beam. The curvature of the turning mirror, can be described by the variation in surface normal direction across the optical beam spot area 'A' (2-dimensional) on the mirror surface=area where the optical intensity is greater than 10% of the maximum intensity on the same mirror surface. In other words a mirror surface is here considered curved if the surface normal direction across a reflective area of the curved turning mirror varies by more than 10 degrees.

Figure 9:
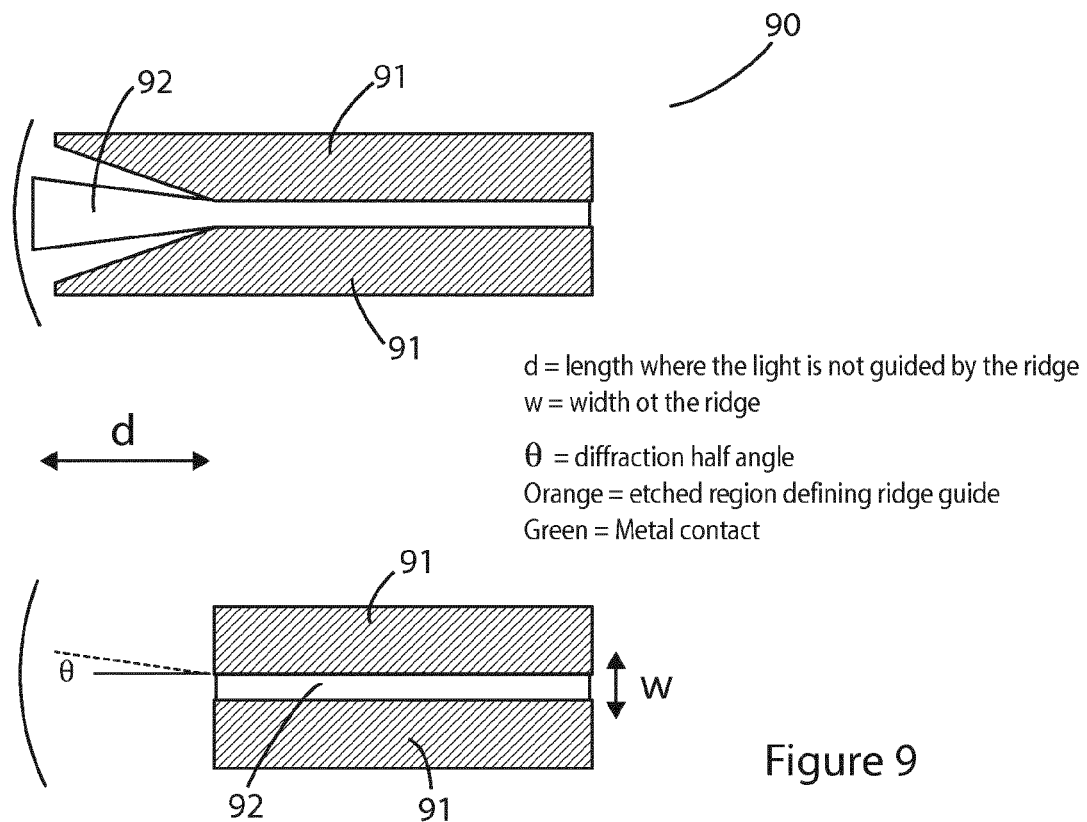
FIG. 9 illustrates how to minimise optical feedback in a SLED device according to one embodiment.

FIG. 9 illustrates how to minimise optical feedback in a SLED device according to one embodiment, indicated generally by the reference numeral 90. Region 91 represents etched regions defining a ridge guide and region 91 can be a metal contact. In order to minimise optical feedback and so prevent lasing as well as to provide a better beam quality it was found that it is beneficial that the superluminescent light be permitted to expand freely in the semiconductor from the end of the guiding region to where it intercepts the reflecting facet. The light will diffract from the aperture by a half angle, θ, in radians of λ/wn where λ is the wavelength, w is the width of the mode as set by the ridge waveguide and n is the refractive index.

That distance from the end of the guiding region to the facet, d, should be at least 50 optical wavelengths, typically >10 microns and preferably be around 40 microns. There should be minimal interruption of transverse waveguide mode for the light propagating from the ridge guiding region to the reflecting facet.

The semiconductor can be pumped or unpumped in that region. The absorption is minimised in the case of GaN devices due to the large Stokes shift between luminescence and absorption in that material system. In the case of InP or GaAs based materials which are used for SLEDs with emission wavelengths >550 nm then the free expansion region could be intermixed to increase the bandgap in that region and thus minimise the residual absorption.

In order to minimise the leakage of current through that free space propagation region the contact layer should be removed while not affecting the transverse mode or made to be of low conductivity by ion implantation or by plasma treatment in the case of p-doped GaN based layers.

Figure 10:
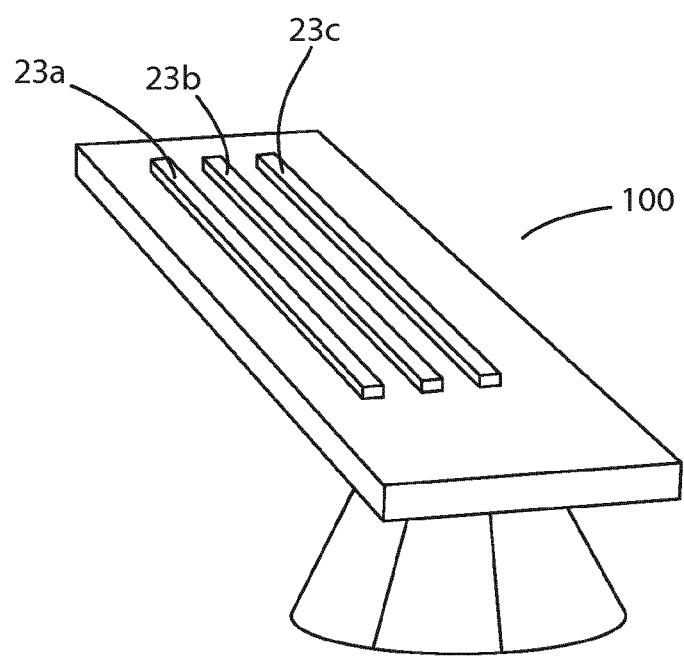
FIG. 10 shows a compact RGB (red-green-blue) light source based on an array of individually addressable LD/SLEDs and colour converting VCSEL structures.

FIG. 10 shows a compact RGB (red-green-blue) light source indicated by the reference numeral 100 based on an array of individually addressable LD/SLEDs 23a, 23b and 23c, and colour converting VCSEL structures (not shown). This can form the light source in a pico-projector with red, green and blue (RGB) lasers, all driven by the same type of primary LD/SLED source. FIG. 10 realises a compact beamed RGB source (a pico-projector module) for display applications. Pico-projectors can be made by directing laser (or SLED) light to a small micro-mirror that generates a flying spot that moves line by line across the full display area. With three lasers for the basic colours (RGB) one can generate a full-colour display. The three lasers can be modulated rapidly and all be directed to the micro-mirror. The solution provides a compact RGB laser (/SLED) platform. In effect a RGB projector system is provided comprising an array of devices as described above where each device is configured to emit a different colour wavelength.

Figure 11A:
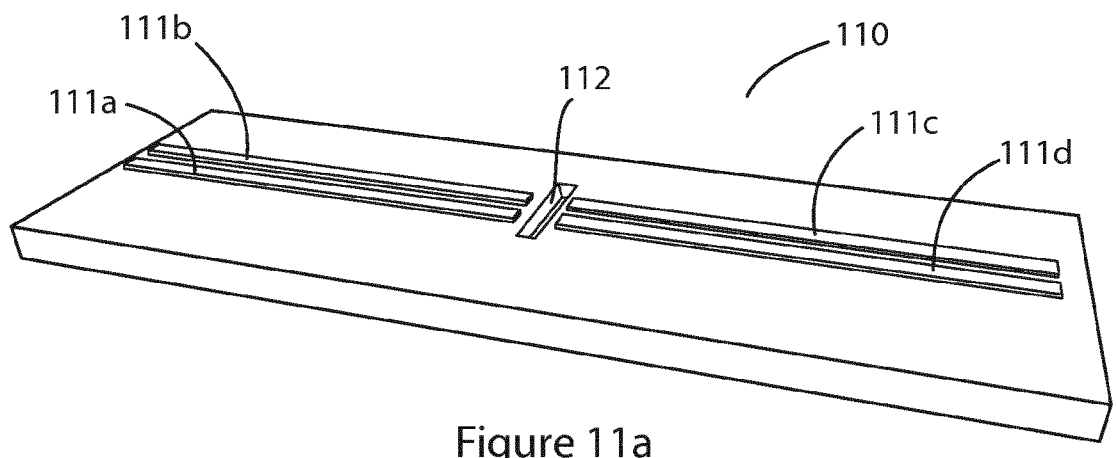
FIGS. 11a & 11b shows a lay-out for four GaN based LDs/SLEDs illuminating four areas on the back surface in close proximity to each other.
Figure 11B:
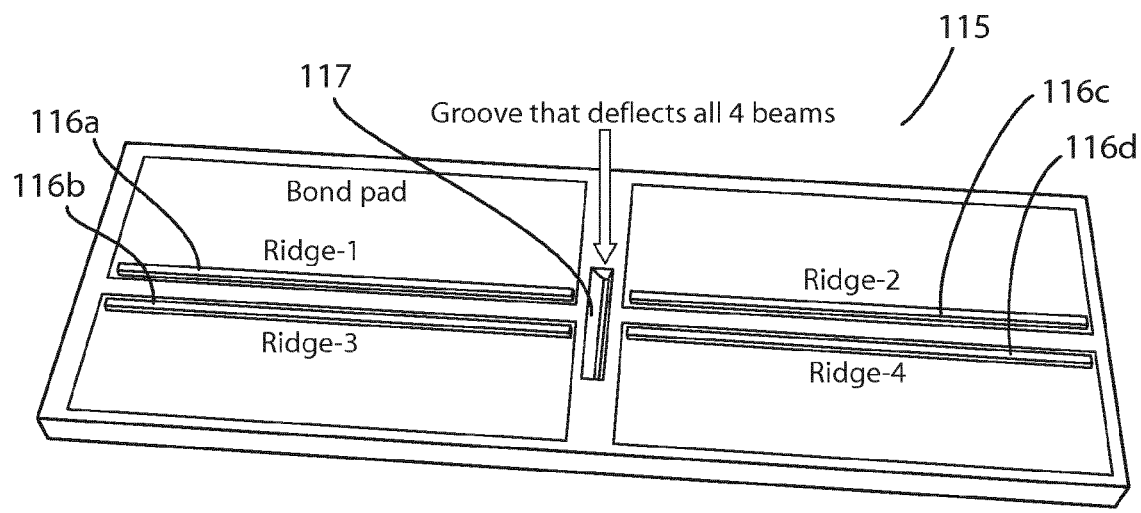

FIGS. 11a & 11b shows a lay-out for four GaN based LDs/SLEDs illuminating four areas on the back surface in close proximity to each other, indicated generally by the reference numeral 110 and 115. Four SLED ridges 111a, 111b, 111c & 111d with 45 degree turning mirror 112 on a thin substrate (coupon) is shown. This can form the basis for four optically pumped VCSELs in close proximity to each other (on the back surface). This in turn yields four lasers with different colours emitting from almost the same location. This same configuration can also be used to increase the optical density on the back surface area by about a factor of four: for that application, the mirrors are to be shaped in such a way that the four beam spots overlap on the back surface. FIG. 11b also shows four SLED ridges 116a, 116b, 116c & 116d and their bond pads with a single reflective element 117 on a thin substrate.

Figure 12:
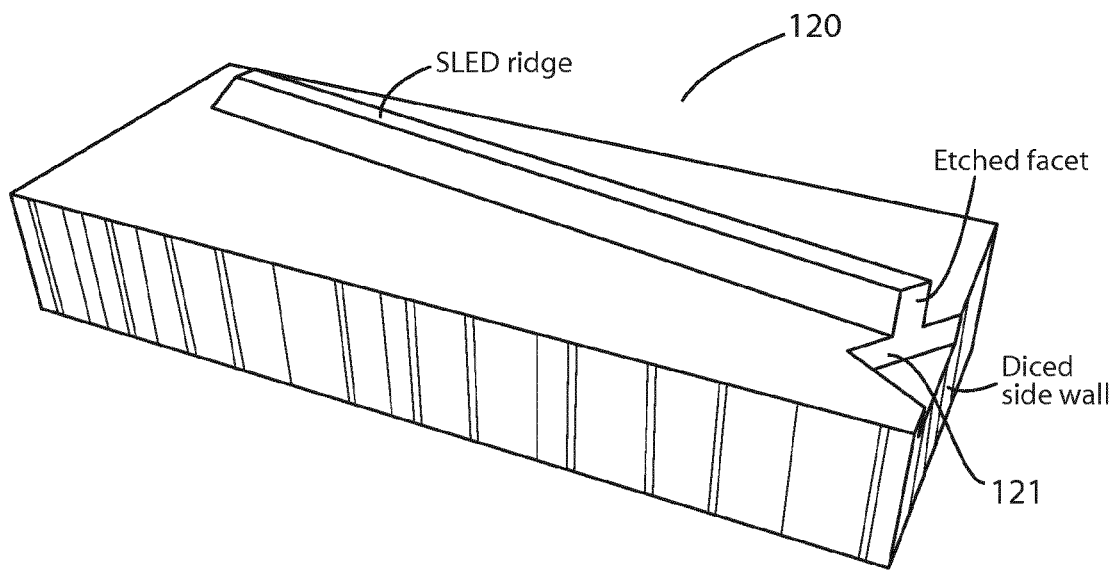
FIG. 12 and FIG. 13 show a design for a low-cost SLED with horizontal emission.

FIG. 12 illustrates an embodiment for a low-cost SLED 120 with horizontal emission (diced chip) 121. Optical feedback can be suppressed by a (curved) deflection mirror at the far end of the ridge.

Figure 13:
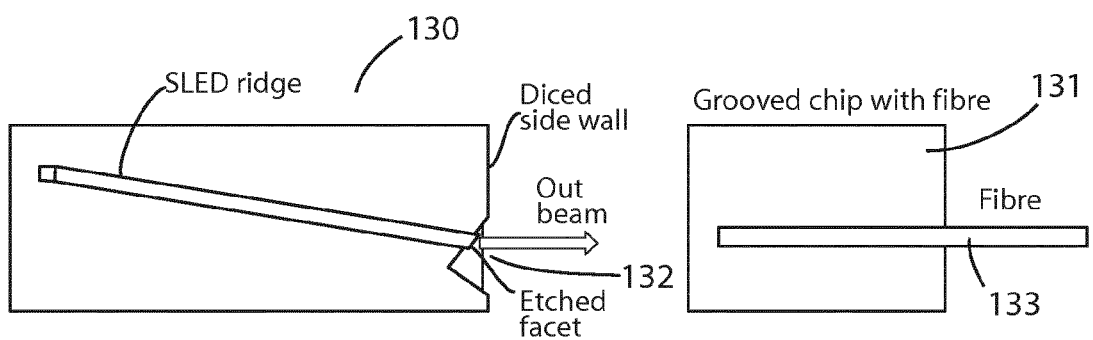

FIG. 13 is a plan view of the design 130 shown in FIG. 12, together with a platform 131 to couple the output beam 132 into an optical fibre 133.

Figure 14:
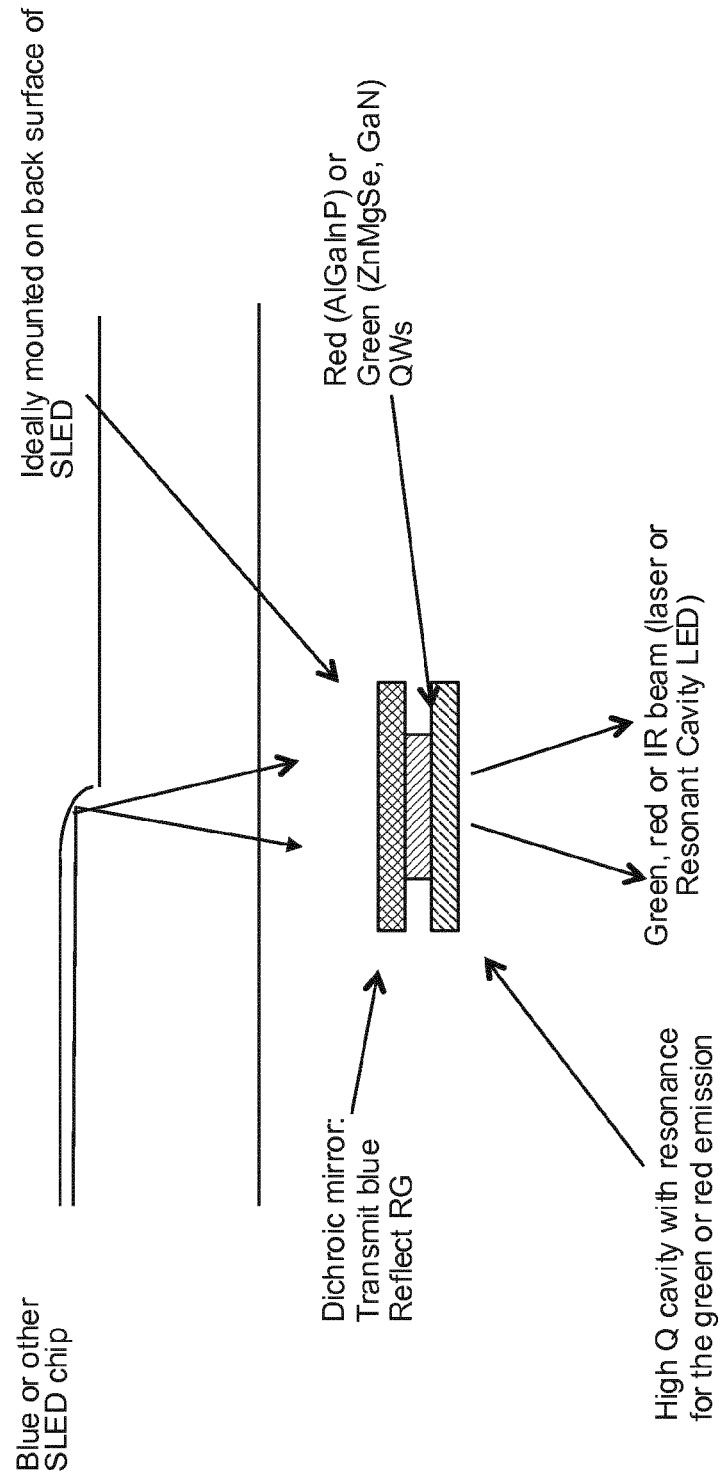
FIG. 14 shows a schematic of a surface emitting laser or resonant cavity LED powered by a SLED, according to one embodiment.

FIG. 14 shows a schematic of a surface emitting laser or resonant cavity LED powered by a SLED, according to one embodiment.

Figure 15:
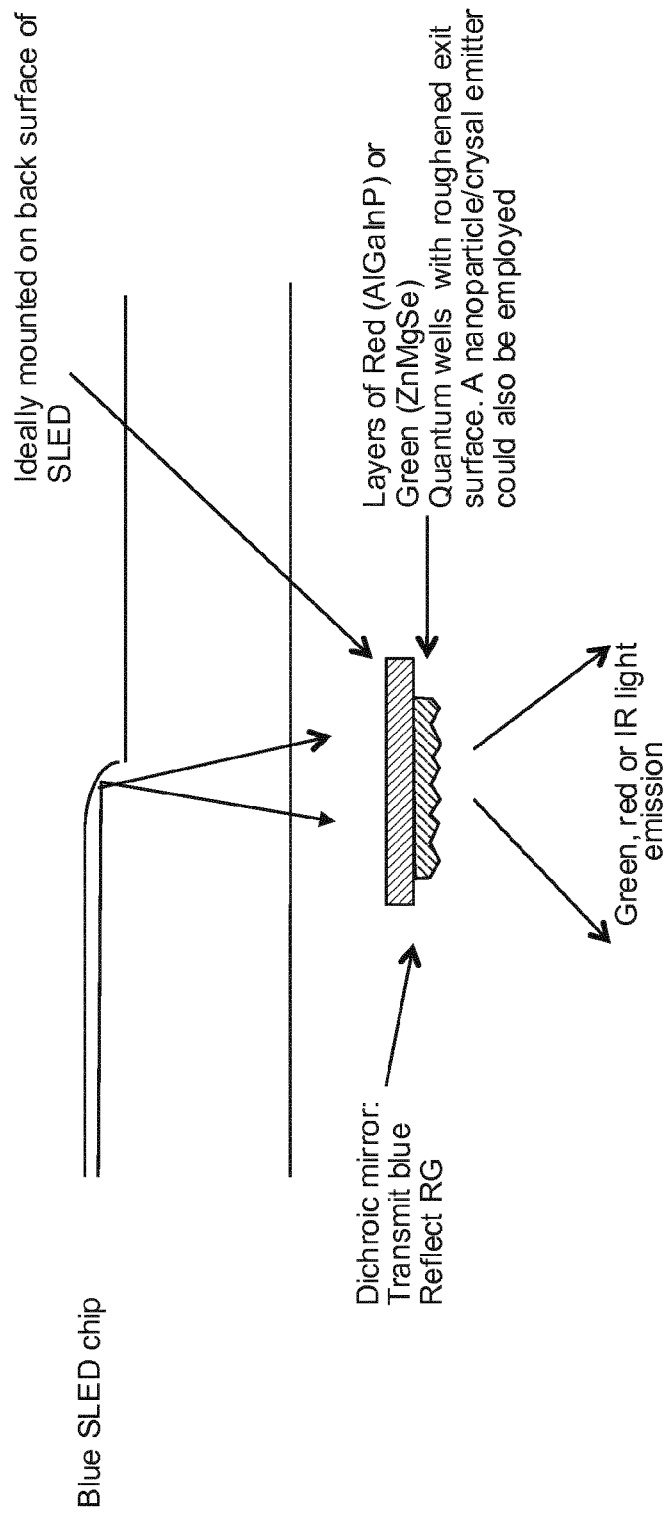
FIG. 15 shows a schematic of an optically pumped LED powered by a SLED, according to one embodiment.

FIG. 15 shows a schematic of an optically pumped LED powered by a SLED, according to another embodiment of the invention.

Figure 16:
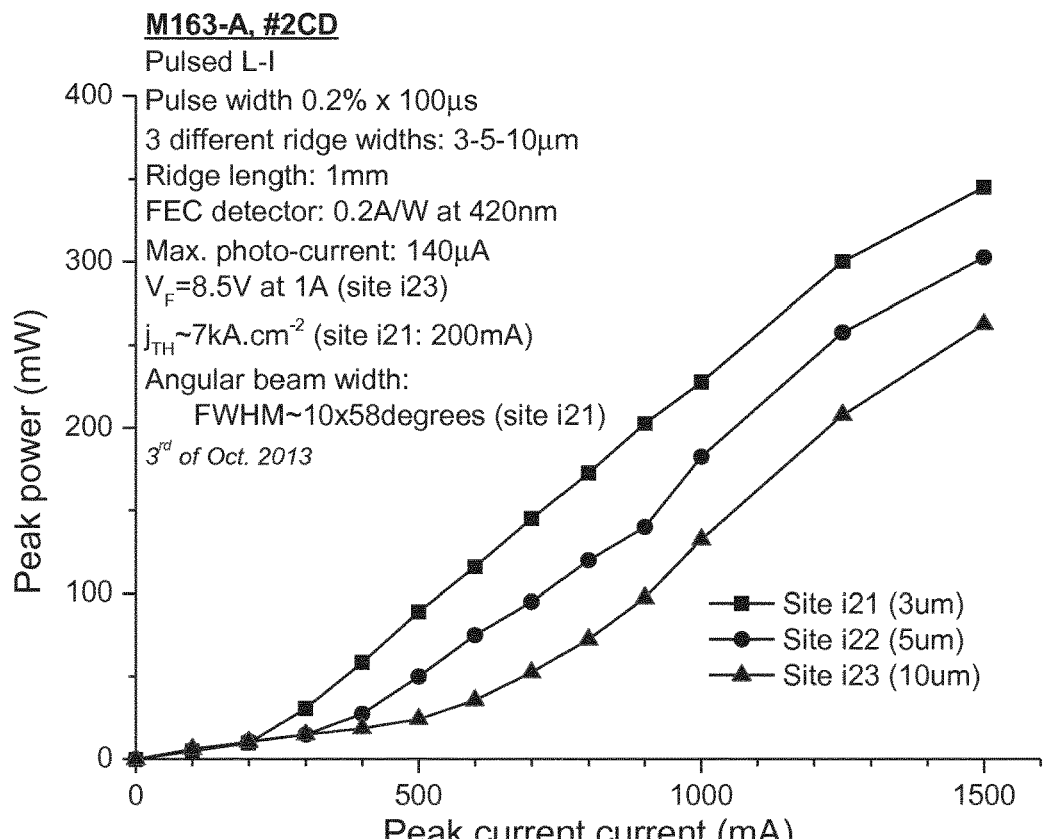
FIG. 16 shows measured pulsed L-I characteristics for a set of three SLED devices with vertical emission, and different ridge widths: 3, 5, and 10 µm. Ridge length: 1 mm. Pulse settings: pulse length: 200 ns. Duty cycle: 0.2%.
Figure 17:
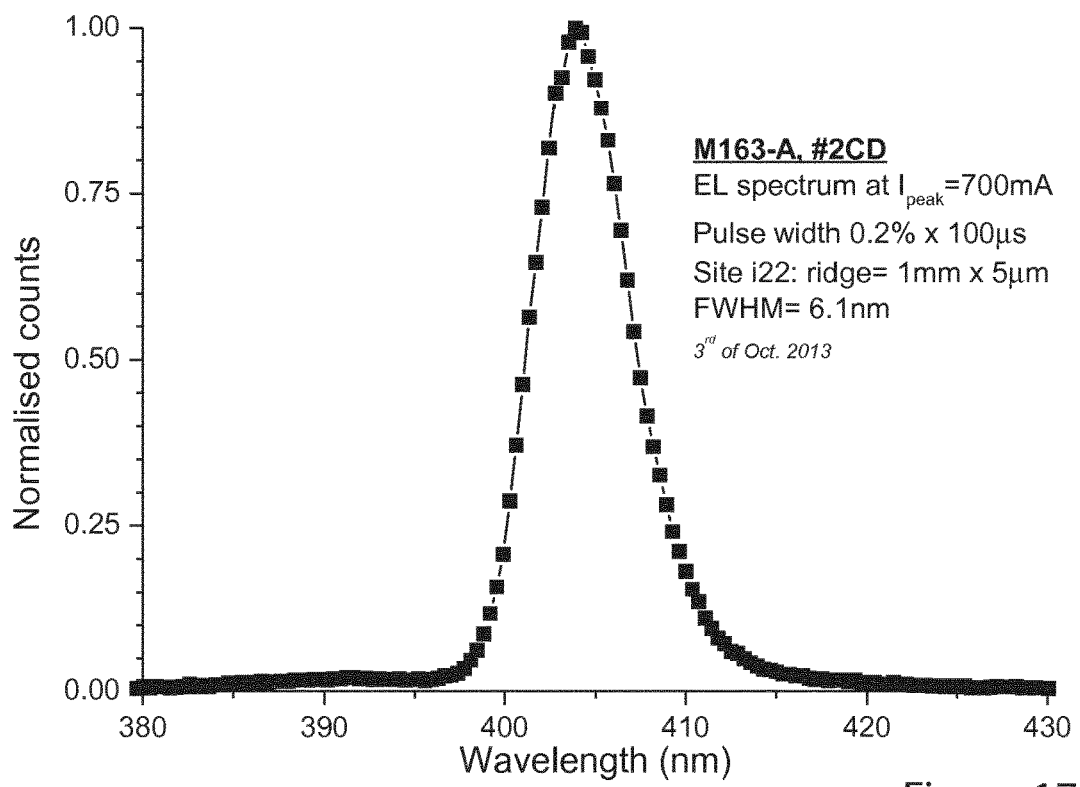
FIG. 17 shows a measured EL spectrum for a vertical SLED device at a pulsed current of 700 mA. The L-I characteristics for this device with a 5 µm ridge width are shown in FIG. 16.

The device fabrication process is very simple to make the devices as hereinbefore described, and the device characteristics tested are shown in FIGS. 16 and 17. Up to 300 mW of optical power (in pulsed mode) was obtained and the emission spectrum was virtually ripple free (indicating that there was almost no optical feedback). This low optical feedback was achieved without the use of any anti-reflection coating.

It will be appreciated that devices can be fabricated in a low-cost way, comparable to a standard LED, with the brightness (radiance) of a conventional edge emitting LD/SLED device. Furthermore, the new configuration lends itself to integration of extra functionality on the light emitting surface.

The new LD/SLED devices of the present invention have applications in systems where high light intensities are required (at low cost) within a small étendu. Examples of such systems are:
1. Fibre based light sources
2. Laser materials (that are to lase under optical excitation)
3. Thin display sheets
4. Pico-projector systems
5. A compact SLED/APD (avalanche photo detector) module [FIG. 4b]

It will be appreciated that a low-cost manufacturing technique can be used for LD/SLEDs, according to the present invention, with a horizontal light beam, by combining cost effective wafer dicing (for chip separation) with facet etching (for an optical finish). With proper design, the SLED beam can be made to emerge perpendicular to the chip sidewall. This horizontal beam configuration suits many applications, such as fibre-coupling.

It will be appreciated that in the context of the present invention LD or SLED devices are light sources with extremely high brightness. In a practical way LD and SLED devices can be distinguished from LED devices by observing the electroluminescence spectrum of the device in the current density range of 0.1-10 kA·cm-2. In a LD/SLED device spectral narrowing of the main emission peak will occur once stimulated emission becomes significant. In LED devices there will be no significant stimulated emission contribution.

It will be appreciated that GaN or FS-GaN (free-standing GaN) as the substrate has been hereinbefore described any other transparent (or perforated) substrates can be also used to bring the invention into effect.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A superluminescent light emitting diode (SLED) device comprising:
a light-guiding structure deposited on a substrate and comprising a plurality of layers that includes a lower cladding layer and an upper cladding layer;
a light generating layer sandwiched between the lower cladding layer and the upper cladding layer and configured to emit an optical beam;
an elongated semiconductor ridge positioned on an upper surface of the substrate and adapted to guide the optical beam along a path parallel to the substrate, wherein the elongated semiconductor ridge is one of a plurality of elongated semiconductor ridges positioned on the upper surface of the substrate, wherein each elongated semiconductor ridge is adapted to guide an additional optical beam parallel to the substrate and along a path corresponding to the each elongated semiconductor ridge;
a reflective element disposed on the upper surface of the substrate and configured to turn the optical beam causing a reflected beam comprising at least a portion of the optical beam to be emitted through a lower surface of the substrate; and
an un-pumped lateral beam expansion gap positioned between an electrically pumped section of the ridge and the reflective element.

2. The SLED device of claim 1 wherein the reflective element comprises a turning mirror.

3. The SLED device of claim 1, wherein the reflective element comprises a turning mirror and the turning mirror is positioned at an angle to the upper surface of the substrate configured such that the reflected beam hits the lower surface at an angle that is within 10 degrees of normal incidence with respect to the lower surface.

4. The substrate emitting SLED device of claim 1, wherein the reflective element comprises a curved turning mirror to reflect the optical beam.

5. The substrate emitting SLED device of claim 1, wherein the reflective element comprises a curved turning mirror to reflect the optical beam and the surface normal direction across a reflective area of the curved turning mirror varies by more than 10 degrees.

6. The SLED device of claim 1, and further comprising a transparent window etched into the substrate and configured to transmit the optical beam through the substrate.

7. The substrate emitting SLED device of claim 1, wherein the light source comprises a secondary, optically pumped laser source positioned on the back surface of the substrate.

8. The substrate emitting SLED device of claim 1, wherein the light source comprises a secondary, optically pumped laser source positioned on the back surface of the substrate and the laser source comprises a Vertical Cavity Surface Emitting Laser (VCSEL) on the back surface.

9. The substrate emitting SLED device of claim 1, and further comprising a lens positioned at the back surface of the substrate where the light is emitted.

10. The substrate emitting SLED device of claim 1, and further comprising a phosphor coating or phosphor coated device positioned at the back surface of the substrate where the light is emitted.

11. The substrate emitting SLED device of claim 1, wherein said device is mounted on a perforated avalanche photo detector chip and configured to emit light through said perforation.

12. The substrate emitting SLED device of claim 1, and further comprising a photodetector positioned at the back surface of the substrate where the light is emitted.

13. The substrate emitting SLED device of claim 1, and further comprising a semiconductor light emitter positioned at the back surface of the substrate where the light is emitted.

14. The substrate emitting SLED device of claim 1, and further comprising a dichroic reflector positioned at the back surface of the substrate where the light is emitted.

15. The SLED device of claim 1, wherein the reflective element is further configured to turn the additional optical beam corresponding to each elongated semiconductor ridge in the plurality of elongated semiconductor ridges along the path parallel to the substrate.

* * * * *